(12) United States Patent
Shi

(10) Patent No.: US 7,839,188 B2
(45) Date of Patent: Nov. 23, 2010

(54) CIRCUIT FOR CLEARING CMOS INFORMATION

(75) Inventor: Lei Shi, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 250 days.

(21) Appl. No.: 12/268,423

(22) Filed: Nov. 10, 2008

(65) Prior Publication Data

US 2010/0090729 A1 Apr. 15, 2010

(30) Foreign Application Priority Data

Oct. 10, 2008 (CN) .................... 2008 1 0304884

(51) Int. Cl.
*H03L 7/00* (2006.01)

(52) U.S. Cl. ...................... 327/143; 713/300

(58) Field of Classification Search ............... 327/142, 327/143, 198; 713/300
See application file for complete search history.

(56) References Cited

U.S. PATENT DOCUMENTS 7,639,063 B2 * 12/2009 Xiong ...................... 327/398

* cited by examiner

*Primary Examiner*—Lincoln Donovan
*Assistant Examiner*—Daniel Rojas
(74) *Attorney, Agent, or Firm*—Zhigang Ma

(57) ABSTRACT

A circuit for clearing complementary metal oxide semiconductor (CMOS) information of a CMOS chip of a computer includes a resistor and an electronic switch. The electronic switch includes a first terminal, a second terminal, and a third terminal. The first terminal is connected to a standby power supply of the computer. The second terminal is connected to a software reset pin of the CMOS chip. The third terminal is connected to a dual power supply of the computer via the resistor, and is connected to a hardware reset pin of the computer. The standby power supply is provided, and the first electronic switch is turned on before the computer is booted up. The software reset pin may be triggered to clear CMOS information of the CMOS chip upon the condition that the hardware reset pin is triggered.

15 Claims, 2 Drawing Sheets

CIRCUIT FOR CLEARING CMOS INFORMATION

BACKGROUND

1. Technical Field

The present disclosure relates to computer circuits, and particularly to a circuit for clearing complementary metal oxide semiconductor (CMOS) information of a computer.

2. Description of the Related Art

With regards to electronics, and particularly to computer electronics, jumpers are generally used to adjust connections of electrical components on printed circuit boards, such as motherboards of computers. Jumper pins (points to be connected by the jumper) are arranged in groups called jumper blocks, with each group having at least one pair of contact points and often more. In general, each contact point in a jumper block terminates using a small metal pin. An appropriately sized conductive sleeve called a jumper, or more technically, a jumper shunt, is slipped over the pins to complete the circuit.

Jumper blocks and jumpers are often used on a motherboard to maintain power supply to a south bridge chip thus safeguarding complementary metal oxide semiconductor (CMOS) information stored therein. Furthermore, the jumpers may be set to invoke a function to clear the CMOS information in the south bridge, and reset the BIOS configuration settings, which allows the computer to boot if an error BIOS setting occurs, or if the CMOS boot password is forgotten. However, using the jumper to clear the CMOS information is time-consuming and inefficient because the computer enclosure must be taken apart before clearing the CMOS information in the south bridge.

What is needed, therefore, is to provide a circuit for clearing CMOS information to overcome the above-mentioned shortcomings.

DETAILED DESCRIPTION

Figure 1:
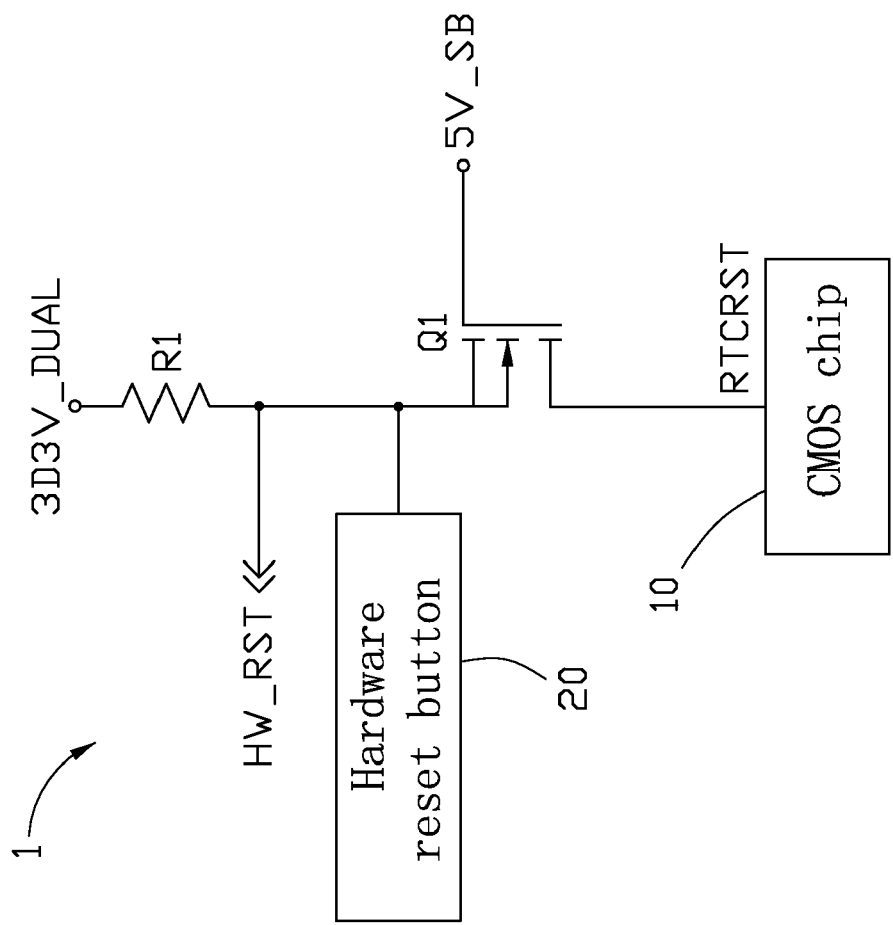
FIG. 1 is a circuit diagram of a first embodiment of a circuit for clearing CMOS information.

Referring to FIG. 1, a circuit 1 for clearing CMOS information of a CMOS chip 10 of a computer includes an electronic switch Q1 and a resistor R1. In the illustrated embodiment of FIG. 1, the electronic switch Q1 is an N-channel metal oxide semiconductor field effect transistor (MOSFET), which includes a gate, a drain, and a source. In other embodiments, the electronic switch Q1 may be a negative-positive-negative (NPN) bipolar junction transistor (BJT), which includes a base, a collector, and an emitter.

The gate of the transistor Q1 is connected to a standby power supply 5V_SB which may supply 5V of power to the transistor Q1 in one particular embodiment. The drain of the transistor Q1 is connected to a software reset pin, such as a real time clock reset (RTCRST) pin of a CMOS chip 10. The source of the transistor Q1 is connected to a hardware reset (HW_RST) pin of the computer, and is also connected to a dual power supply 3D3V_DUAL of the computer via the resistor R1. The HW_RST pin is connected to a hardware reset button 20 in a front panel of the computer.

In one embodiment, information of the CMOS chip 10 is cleared upon the condition that the RTCRST pin outputs a low level signal, such as about zero volts in one exemplary example. The dual power supply 3D3V_DUAL outputs a voltage, whether the computer is in an operating state or a sleep state.

The standby power supply 5V_SB is provided, and the transistor Q1 is turned on before the computer is booted up. The HW_RST pin is connected to the RTCRST pin. The RTCRST pin outputs a low level signal upon the condition that the hardware reset button 20 is triggered, and so that the information of the CMOS chip 10 is cleared.

Figure 2:
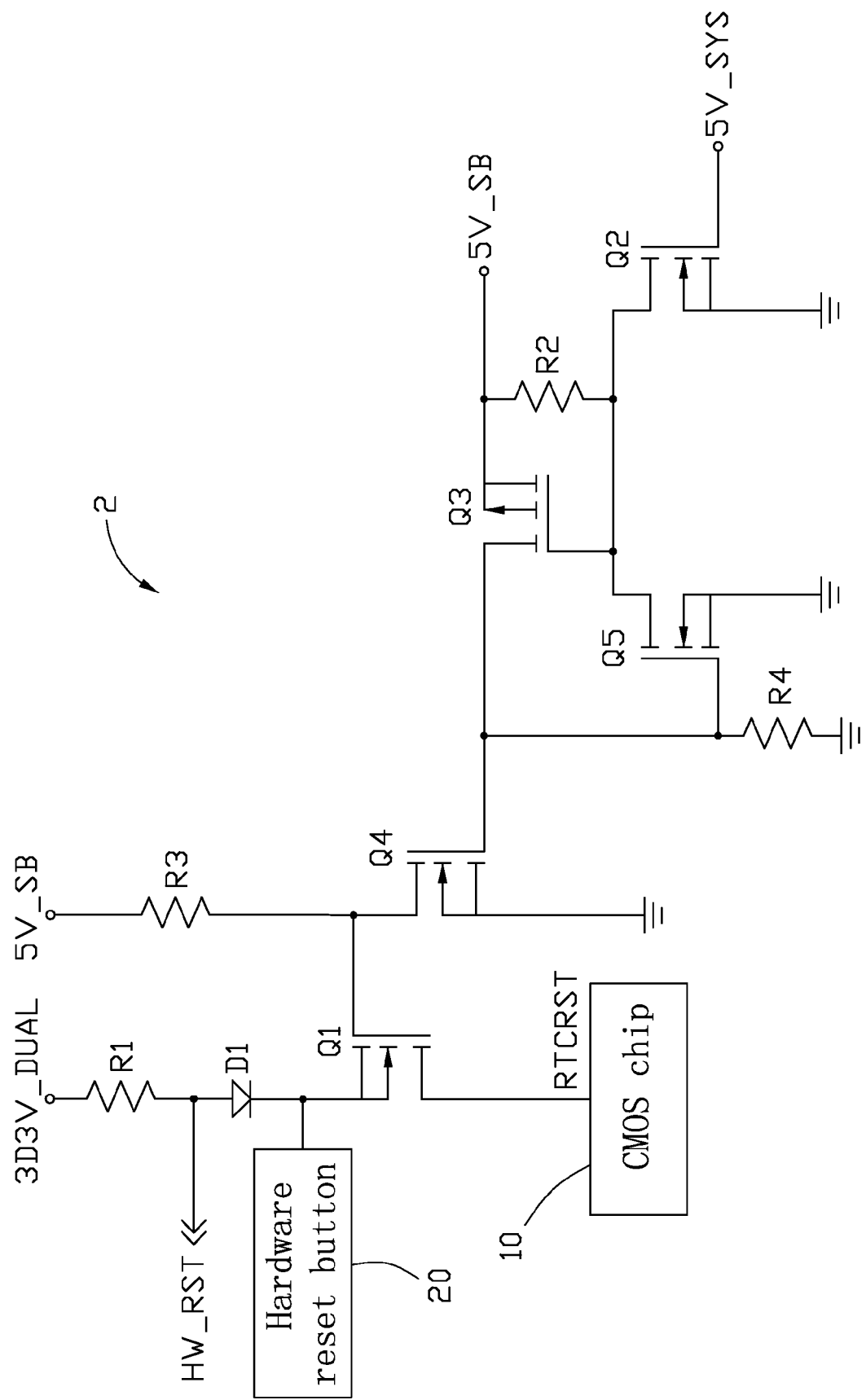
FIG. 2 is a circuit diagram of a second embodiment of a circuit for clearing CMOS information.

Referring to FIG. 2, an alternative embodiment of a circuit 2 for clearing CMOS information of a computer may be used to clear the information of the CMOS chip 10. The circuit 2 may also be used to avoid an unexpected operation of the CMOS chip 10 by triggering the hardware reset button 20, such as clearing the information of the CMOS chip 10. The circuit 2 includes five electronic switches Q1-Q5, a diode D1, and four resistors R1-R4. In the illustrated embodiment of FIG. 2, the electronic switches Q1, Q2, Q4, and Q5 are N-channel MOSFETs, and the electronic switch Q3 is a P-channel MOSFET. Each MOSFET includes a gate, a drain, and a source. In other embodiments, the electronic switches Q1, Q2, Q4, and Q5 may be NPN BJTs, and the electronic switch Q3 may be a positive-negative-positive (PNP) BJT. Each BJT may include a base, a collector, and an emitter.

The gate of the transistor Q1 is connected to the standby power supply 5V_SB of the computer via the resistor R3. The drain of the transistor Q1 is connected to the RTCRST pin of the CMOS chip 10. The source of the transistor Q1 is connected to a cathode of the diode D1. An anode of the diode D1 is connected to the HW_RST pin, and is also connected to the dual power supply 3D3V_DUAL of the computer via the resistor R1. The cathode of the diode D1 is also connected to the hardware reset button 20.

The gate of the transistor Q2 is connected to a system power supply 5V_SYS of the computer. The drain of the transistor Q2 is connected to the standby power supply 5V_SB via the resistor R2. The source of the Q2 is grounded. The gate of the transistor Q3 is connected to the drain of the transistor Q2. The source of the transistor Q3 is connected to the standby power supply 5V_SB. The gate of the transistor Q4 is connected to the drain of the transistor Q3. The drain of the transistor Q4 is connected to the gate of the transistor Q1. The source of the Q4 is grounded. The gate of the transistor Q5 is connected to the drain of the transistor Q3, and is grounded via the resistor R4. The drain of the transistor Q5 is connected to the gate of the transistor Q3. The source of the transistor Q5 is grounded.

In one embodiment, the voltage outputted by the dual power supply 3D3V_DUAL makes sure that the diode D1 is on, and the hardware reset button 20 is connected to the HW_RST pin. The diode D1 may prevent current in unintended directions. The standby power supply 5V_SB is provided, and the transistor Q1 is turned on before the computer is booted up. The HW_RST pin is connected to the RTCRST pin of the CMOS chip 10. The RTCRST pin outputs a low level signal upon the condition that the hardware reset button 20 is triggered, and so that the information of the CMOS chip 10 is cleared.

The system power supply 5V_SYS is provided, and the transistor Q2 is turned on when the computer is working normally. The gate of the transistor Q3 receives a low level signal, and the transistor Q3 is turned on. The gate of the transistor Q4 receives a high level signal, and the transistor Q4 is turned on. The gate of the transistor Q1 receives a low level signal. The transistor Q1 is turned off to prevent the information of the CMOS chip 10 from being cleared when the hardware reset button 20 is triggered. The HW_RST pin outputs a low level signal upon the condition that the hardware reset button 20 is triggered, and the computer is rebooted.

The gate of the transistor Q5 receives a high level signal from the drain of the transistor Q3, and the transistor Q5 is turned on. The drain of the transistor Q5 outputs a low level signal at an instant of the computer entering a sleep state from the operating state. The gate of the transistor Q3 receives the low level signal from the drain of the transistor Q5. Therefore, both of the transistors Q3 and Q5 are kept turned on even if the computer is in the sleep state. The transistor Q4 is turned on. The transistor Q1 is turned off to avoid an unexpected operation of the CMOS chip 10, such as clearing the information of the CMOS chip 10, as a result from triggering the hardware reset button 20. The computer is rebooted upon the condition that the hardware reset button 20 is triggered. Triggering the hardware reset button 20 may be accomplished by pushing of the hardware reset button 20 in one embodiment.

The circuit for clearing CMOS information allows the CMOS information of the CMOS chip 10 to be cleared conveniently before the computer is booted up. Unintended operations of the CMOS chip 10 are prevented regardless if the computer enters the operating state or the sleep state, after boot up.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skills in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A circuit for clearing complementary metal oxide semiconductor (CMOS) information of a CMOS chip of a computer, the circuit comprising:
    a first resistor, a first end of the first resistor is connected to a dual power supply of the computer; and
    a first electronic switch comprising:
        a first terminal connected to a standby power supply of the computer;
        a second terminal connected to a software reset pin of the CMOS chip; and
        a third terminal connected to a second end of the first resistor, and connected to a hardware reset pin of the computer;
    wherein the first electronic switch is configured to be turned on by the standby power supply before the computer is booted up such that the triggering of the hardware reset pin triggers the software reset pin to clear CMOS information of the CMOS chip.

2. The circuit of claim 1, wherein the hardware reset pin is connected to a hardware reset button of the computer.

3. The circuit of claim 2, wherein pushing the hardware reset button of the computer triggers the hardware reset pin.

4. The circuit of claim 1, wherein the software reset pin is a real time clock reset (RTCRST) pin of the CMOS chip.

5. The circuit of claim 1, further comprising a diode connected between the hardware reset pin and the hardware reset button, wherein the diode comprises an anode connected to the hardware reset pin, and a cathode connected to the hardware reset button; the dual power supply supplies power to turn on the diode regardless if the computer is in an operating state or a sleep state, wherein operation of the hardware reset button triggers the hardware reset pin.

6. The circuit of claim 1, further comprising:
    a second electronic switch comprises:
        a first terminal connected to a system power supply of the computer;
        a second terminal connected to a first end of a second resistor, a second end of the second resistor connected to the standby power supply; and
        a grounded third terminal;
    a third electronic switch comprises:
        a first terminal connected to the second terminal of the second electronic switch;
        a second terminal; and
        a third terminal connected to the standby power supply; and
    a fourth electronic switch comprises:
        a first terminal connected to the second terminal of the third electronic switch;
        a second terminal connected to the first terminal of the first electronic switch, and connected to a first end of a third resistor, a second end of the third resistor is connected to the standby power supply; and
        a grounded third terminal;
    wherein the system power supply is provided to the first terminal of the second electronic switch upon a condition that the computer is in the operation state, and the second electronic switch is turned on, the third and fourth electronic switches are turned on, the first electronic switch is turned off such that the CMOS information of the CMOS chip is prevented from being cleared when the hardware reset pin is triggered.

7. The circuit of claim 6, further comprising a fifth electronic switch, wherein the fifth electronic switch comprises:
    a first terminal connected to the second terminal of the third electronic switch, and connected to a first end of a fourth resistor, a second end of the fourth resistor is grounded;
    a second terminal connected to the first terminal of the third electronic switch; and
    a grounded third terminal;
    wherein the first terminal of the fifth electronic switch receives a high level signal from the second terminal of the third electronic switch to turn on the fifth electronic switch, the first terminal of the third electronic switch receives a low level signal at an instant of the computer entering the sleep state from the operation state to keep the third electronic switch being on when the computer is in the sleep state, the fourth electronic switch is on, and the first electronic switch is off such that the CMOS information of the CMOS chip is prevented from being cleared when the hardware reset pin is triggered.

8. The circuit of claim 7, wherein the first electronic switch, the second electronic switch, the fourth electronic switch, and the fifth electronic switches are N-channel metal oxide semiconductor field effect transistors, the third electronic switch is a P-channel metal oxide semiconductor field effect transistor, the first terminal of each of the first to fifth electronic switches is a gate, the second terminal of each of the first-fifth electronic switches is a drain, and the third terminal of each of the first-fifth electronic switches is a source.

9. A method for clearing complementary metal oxide semiconductor (CMOS) information of a CMOS chip of a computer, the method comprising:
providing:
a first resistor having a first end connected to a dual power supply of the computer; and
a first electronic switch comprising a first terminal, a second terminal connected to a software reset pin of the CMOS chip, and a third terminal connected to a second end of the first resistor, the third terminal also connected to a hardware reset pin of the computer;
receiving power from a standby power supply of the computer by the first terminal of the first electronic switch to turn on the first electronic switch;
triggering the hardware reset pin to output a low level signal to the software reset pin;
receiving the low level signal by the software reset pin from the hardware reset pin to clear the CMOS information of the CMOS chip.

10. The method of claim 9, further comprising connecting the hardware reset pin to a hardware reset button of the computer.

11. The method of claim 10, wherein pushing the hardware reset button of the computer triggers the hardware reset pin.

12. The method of claim 9, wherein the software reset pin is a real time clock reset (RTCRST) pin of the CMOS chip.

13. The method of claim 9, further comprising:
providing a second electronic switch, a third electronic switch, and a fourth electronic switch, wherein each of the second to fourth second electronic switches comprises a first terminal, a second terminal, and a third terminal, wherein the third terminals of the second and fourth electronic switches are grounded;
receiving power from a system power supply of the computer by the first terminal of the second electronic switch to turn on the second electronic switch;
receiving a low level signal from the second terminal of the second electronic switch by the first terminal of the third electronic switch to turn on the third electronic switch;
receiving a high level signal from the standby power supply by the first terminal of the fourth electronic switch via the third electronic switch to turn on the fourth electronic switch;
receiving a low level signal from the second terminal of the fourth electronic switch by the first terminal of the first electronic switch to turn off the first electronic switch; and
disconnecting the hardware reset pin to the software reset pin of the CMOS chip to protect information of the CMOS chip.

14. The method of claim 13, further comprising:
providing a fifth electronic switch comprising a first terminal, a second terminal, and a third terminal;
receiving a high level signal from the second terminal of the third electronic switch by the first terminal of the fifth electronic switch, to turn on the fifth electronic switch;
maintaining a low voltage level at the second terminal of the fifth electronic switch when the computer enters a sleep state to keep the third and fifth electronic switches being on after the computer enters the sleep state;
turning on the fourth electronic switch;
turning off the first electronic switch; and
disconnecting the hardware reset pin to the software reset pin of the CMOS chip to protect information of the CMOS chip.

15. The method of claim 14, wherein the first electronic switch, the second electronic switch, the fourth electronic switch, and the fifth electronic switch are N-channel metal oxide semiconductor field effect transistors, the third electronic switch is a P-channel metal oxide semiconductor field effect transistor, the first terminal of each of the first to fifth electronic switches is a gate, the second terminal of each of the first-fifth electronic switches is a drain, and the third terminal of each of the first-fifth electronic switches is a source.

* * * * *